US012097956B2

(12) United States Patent
Lavoie

(10) Patent No.: US 12,097,956 B2
(45) Date of Patent: Sep. 24, 2024

(54) DRONE WITH TOOL POSITIONING SYSTEM

(71) Applicant: HYDRO-QUEBEC, Montréal (CA)

(72) Inventor: Samuel Lavoie, Ste-Julie (CA)

(73) Assignee: HYDRO-QUEBEC, Montreal (CA)

( * ) Notice: Subject to any disclaimer, the term of this patent is extended or adjusted under 35 U.S.C. 154(b) by 0 days.

(21) Appl. No.: 17/730,293

(22) Filed: Apr. 27, 2022

(65) Prior Publication Data

US 2022/0348323 A1  Nov. 3, 2022

(30) Foreign Application Priority Data

Apr. 30, 2021 (CA) .................................. CA 3116940

(51) Int. Cl.
| B64C 39/02 | (2023.01) |
| B64U 10/13 | (2023.01) |
| B64U 101/00 | (2023.01) |
| G01R 31/08 | (2020.01) |

(52) U.S. Cl.
CPC .......... *B64C 39/024* (2013.01); *G01R 31/085* (2013.01); *B64U 10/13* (2023.01); *B64U 2101/00* (2023.01)

(58) Field of Classification Search
CPC .... B64C 39/024; G01R 31/085; B64U 10/13; B64U 2101/00; H02G 1/02
See application file for complete search history.

(56) References Cited

U.S. PATENT DOCUMENTS

| 6,879,163 | B2 | 4/2005 | Ormin |
| 8,060,270 | B2 | 11/2011 | Vian et al. |
| 8,505,461 | B2 | 8/2013 | Phillips |
| 8,666,553 | B2 | 3/2014 | Phillips |
| 8,991,273 | B2 | 3/2015 | Phillips et al. |
| 9,753,461 | B1 | 9/2017 | Johnson et al. |
| 10,613,429 | B1 | 4/2020 | Wingo |
| 10,899,475 | B1 | 1/2021 | Freeman, Jr. |
| 2006/0114122 | A1 | 6/2006 | Jones |

(Continued)

FOREIGN PATENT DOCUMENTS

| CA | 3044139 C | 5/2018 |
| CN | 101574983 A | 11/2009 |

(Continued)

OTHER PUBLICATIONS

European Search Report, EP17873895.1, Jul. 9, 2021.

(Continued)

*Primary Examiner* — Christopher P McAndrew
*Assistant Examiner* — Zannatul Ferdous
(74) *Attorney, Agent, or Firm* — NORTON ROSE FULBRIGHT CANADA LLP

(57) ABSTRACT

A tool positioning system of an unmanned aerial vehicle that is mountable relative to a power line to monitor a component of the line. The tool positioning system includes a displacement module having a first member mountable to one side of a body of the unmanned aerial vehicle, a second member movable vertically relative to the first member on the side of the body, and a tool holder pivotably coupled to the second member and couplable to a tool. The tool holder is movable relative to the body to mount the tool to or around the component.

16 Claims, 7 Drawing Sheets

(56) References Cited

U.S. PATENT DOCUMENTS

| | | |
|---|---|---|
| 2008/0276823 A1 | 11/2008 | Montambault et al. |
| 2011/0196536 A1 | 8/2011 | Phillips et al. |
| 2012/0055766 A1 | 3/2012 | Greer et al. |
| 2015/0204480 A1 | 7/2015 | Lorimer et al. |
| 2015/0115927 A1 | 8/2015 | Vinogradova et al. |
| 2016/0023761 A1 | 1/2016 | McNally |
| 2017/0012413 A1 | 1/2017 | Barbosa et al. |
| 2017/0168107 A1 | 6/2017 | Vinogradova et al. |
| 2018/0120196 A1 | 5/2018 | Georgeson |
| 2018/0157251 A1 | 6/2018 | Cole et al. |
| 2018/0158232 A1 | 6/2018 | Cole et al. |
| 2018/0205207 A1 | 7/2018 | Lagosz-Sinclair et al. |
| 2018/0329417 A1 | 11/2018 | Abuhasira et al. |
| 2019/0159444 A1 | 5/2019 | Schwartz et al. |
| 2019/0176984 A1 | 6/2019 | Wabnegger |
| 2019/0260191 A1* | 8/2019 | Lavoie ............... B64C 39/024 |
| 2019/0280467 A1 | 9/2019 | Hall et al. |
| 2019/0286119 A1 | 9/2019 | Cole et al. |
| 2019/0286146 A1 | 9/2019 | Cole et al. |
| 2019/0287688 A1 | 9/2019 | Cole et al. |
| 2019/0325668 A1 | 10/2019 | Cole et al. |
| 2019/0382111 A1 | 12/2019 | Schwartz et al. |
| 2020/0041560 A1 | 2/2020 | Schwartz et al. |
| 2020/0317336 A1 | 10/2020 | Beiro et al. |
| 2020/0325977 A1 | 10/2020 | Greer et al. |
| 2021/0024212 A1* | 1/2021 | Andeweg ............ B64U 10/14 |
| 2021/0232141 A1* | 7/2021 | Georgeson ......... B64U 10/13 |
| 2021/0356255 A1* | 11/2021 | Sweers ............ G01B 11/303 |

FOREIGN PATENT DOCUMENTS

| | | | |
|---|---|---|---|
| CN | 202632111 U | 12/2012 | |
| CN | 202632112 U | 12/2012 | |
| CN | 102879692 A | 1/2013 | |
| CN | 102891453 A | 1/2013 | |
| CN | 102929288 A | 2/2013 | |
| CN | 202815124 U | 3/2013 | |
| CN | 202817597 U | 3/2013 | |
| CN | 202817605 U | 3/2013 | |
| CN | 103010070 A | 4/2013 | |
| CN | 202896375 U | 4/2013 | |
| CN | 103078673 A | 5/2013 | |
| CN | 103163881 A | 6/2013 | |
| CN | 103224026 A | 7/2013 | |
| CN | 203039688 U | 7/2013 | |
| CN | 203094465 U | 7/2013 | |
| CN | 203102023 U | 7/2013 | |
| CN | 103235602 A | 8/2013 | |
| CN | 103292752 A | 9/2013 | |
| CN | 103318405 A | 9/2013 | |
| CN | 203193785 U | 9/2013 | |
| CN | 203219298 U | 9/2013 | |
| CN | 101811578 B | 10/2013 | |
| CN | 103332296 A | 10/2013 | |
| CN | 103353297 A | 10/2013 | |
| CN | 103368103 A | 10/2013 | |
| CN | 203301131 U | 11/2013 | |
| CN | 102611200 B | 12/2013 | |
| CN | 103454556 A | 12/2013 | |
| CN | 103457654 A | 12/2013 | |
| CN | 102589524 B | 1/2014 | |
| CN | 203381787 U | 1/2014 | |
| CN | 203387113 U | 1/2014 | |
| CN | 203387114 U | 1/2014 | |
| CN | 203397214 U | 1/2014 | |
| CN | 102722178 B | 2/2014 | |
| CN | 103587705 A | 2/2014 | |
| CN | 103591938 A | 2/2014 | |
| CN | 102736632 B | 3/2014 | |
| CN | 103675609 A | 3/2014 | |
| CN | 103684571 A | 3/2014 | |
| CN | 203479958 U | 3/2014 | |
| CN | 203567947 U | 4/2014 | |
| CN | 102201865 B | 5/2014 | |
| CN | 103796248 A | 5/2014 | |
| CN | 103812052 A | 5/2014 |
| CN | 103823449 A | 5/2014 |
| CN | 103823450 A | 5/2014 |
| CN | 103823451 A | 5/2014 |
| CN | 103824233 A | 5/2014 |
| CN | 203608201 U | 5/2014 |
| CN | 203608303 U | 5/2014 |
| CN | 203608304 U | 5/2014 |
| CN | 102591355 B | 6/2014 |
| CN | 103839194 A | 6/2014 |
| CN | 103886189 A | 6/2014 |
| CN | 203658576 U | 6/2014 |
| CN | 203673535 U | 6/2014 |
| CN | 103941745 A | 7/2014 |
| CN | 103941746 A | 7/2014 |
| CN | 203681868 U | 7/2014 |
| CN | 203740134 U | 7/2014 |
| CN | 103963991 A | 8/2014 |
| CN | 104002963 A | 8/2014 |
| CN | 104029817 A | 9/2014 |
| CN | 104044725 A | 9/2014 |
| CN | 104062637 A | 9/2014 |
| CN | 104065860 A | 9/2014 |
| CN | 203825467 U | 9/2014 |
| CN | 203845019 U | 9/2014 |
| CN | 104071337 A | 10/2014 |
| CN | 104071342 A | 10/2014 |
| CN | 104076820 A | 10/2014 |
| CN | 104101332 A | 10/2014 |
| CN | 104122560 A | 10/2014 |
| CN | 203858359 U | 10/2014 |
| CN | 203864994 U | 10/2014 |
| CN | 203876987 U | 10/2014 |
| CN | 203881938 U | 10/2014 |
| CN | 203902839 U | 10/2014 |
| CN | 203902842 U | 10/2014 |
| CN | 203911339 U | 10/2014 |
| CN | 102879692 B | 11/2014 |
| CN | 104239899 A | 12/2014 |
| CN | 104242151 A | 12/2014 |
| CN | 203996897 U | 12/2014 |
| CN | 204010209 U | 12/2014 |
| CN | 204056303 U | 12/2014 |
| CN | 204089305 U | 1/2015 |
| CN | 204119375 U | 1/2015 |
| CN | 204119397 U | 1/2015 |
| CN | 104332894 A | 2/2015 |
| CN | 204144805 U | 2/2015 |
| CN | 204166080 U | 2/2015 |
| CN | 102915037 B | 3/2015 |
| CN | 102929288 B | 3/2015 |
| CN | 104406762 A | 3/2015 |
| CN | 104459285 A | 3/2015 |
| CN | 204191661 U | 3/2015 |
| CN | 204210729 U | 3/2015 |
| CN | 204210732 U | 3/2015 |
| CN | 204216106 U | 3/2015 |
| CN | 204223188 U | 3/2015 |
| CN | 102891453 B | 4/2015 |
| CN | 104483974 A | 4/2015 |
| CN | 104485606 A | 4/2015 |
| CN | 104494820 A | 4/2015 |
| CN | 104503465 A | 4/2015 |
| CN | 104527990 A | 4/2015 |
| CN | 104527991 A | 4/2015 |
| CN | 104535054 A | 4/2015 |
| CN | 104536459 A | 4/2015 |
| CN | 104536460 A | 4/2015 |
| CN | 104536467 A | 4/2015 |
| CN | 204236782 U | 4/2015 |
| CN | 204264449 U | 4/2015 |
| CN | 104597907 A | 5/2015 |
| CN | 104655114 A | 5/2015 |
| CN | 204310057 U | 5/2015 |
| CN | 204310058 U | 5/2015 |
| CN | 204313850 U | 5/2015 |
| CN | 204329971 U | 5/2015 |
| CN | 204331470 U | 5/2015 |
| CN | 103010070 B | 6/2015 |

(56) References Cited

FOREIGN PATENT DOCUMENTS

| | | |
|---|---|---|
| CN | 104670480 A | 6/2015 |
| CN | 104682267 A | 6/2015 |
| CN | 204399485 U | 6/2015 |
| CN | 104796672 A | 7/2015 |
| CN | 204433050 U | 7/2015 |
| CN | 204489177 U | 7/2015 |
| CN | 204497664 U | 7/2015 |
| CN | 104828254 A | 8/2015 |
| CN | 104836155 A | 8/2015 |
| CN | 104867134 A | 8/2015 |
| CN | 204548519 U | 8/2015 |
| CN | 204564608 U | 8/2015 |
| CN | 104883218 A | 9/2015 |
| CN | 104898653 A | 9/2015 |
| CN | 104898697 A | 9/2015 |
| CN | 104898700 A | 9/2015 |
| CN | 204615968 U | 9/2015 |
| CN | 204805892 U | 11/2015 |
| CN | 106093618 A | 11/2016 |
| CN | 106129890 | 11/2016 |
| CN | 109255336 A | 1/2019 |
| CN | 110188786 A | 8/2019 |
| EP | 2983259 | 2/2016 |
| EP | 2983259 A | 2/2016 |
| EP | 3104184 A1 | 12/2016 |
| EP | 3253654 A1 | 12/2017 |
| EP | 3633396 A1 | 4/2020 |
| FR | 3035275 A1 | 10/2016 |
| JP | 2016135046 A | 7/2016 |
| JP | 2018034284 | 3/2018 |
| JP | 2018034285 | 3/2018 |
| RU | 2634931 C1 | 11/2017 |
| RU | 2646544 C1 | 3/2018 |
| RU | 2647106 C1 | 3/2018 |
| RU | 2017146365 A | 6/2019 |
| RU | 2703398 C1 | 10/2019 |
| WO | 2010014748 A1 | 2/2010 |
| WO | 2013135044 A1 | 9/2013 |
| WO | 2015/115927 A1 | 8/2015 |
| WO | 2017221235 A1 | 12/2017 |
| WO | 2017221236 A1 | 12/2017 |
| WO | 201816991 A1 | 1/2018 |
| WO | 2018015959 A1 | 1/2018 |
| WO | 2018015960 A1 | 1/2018 |
| WO | 201842692 A1 | 3/2018 |
| WO | 201842693 A1 | 3/2018 |
| WO | 2018064754 A1 | 4/2018 |
| WO | 2018104780 A2 | 6/2018 |
| WO | 2018104786 A1 | 6/2018 |
| WO | 2018104790 A1 | 6/2018 |
| WO | 2018185519 A2 | 10/2018 |
| WO | 2019168429 A1 | 9/2019 |
| WO | 2020161607 | 8/2020 |
| WO | 2020161607 A1 | 8/2020 |
| WO | 2020171743 A1 | 8/2020 |
| WO | 2020210131 | 10/2020 |

OTHER PUBLICATIONS

Pinto, Ary V az, et al. "Remote detection of internal corrosion in conductor cables of power transmission lines." 1st IEEE International Conference on Applied Robotics for the Power.
International Search Report and Written Opinion dated Feb. 22, 2018 for application PCT/CA2017/051385.
Montambault, S. et al., "Hydro-Quebec's Power Line Robotics Program: 15 years of development, implementation and partnerships." 3rd IEEE International Conference on Applied Robotics for the Power Industry) (CARPI), 2014.
Pagnano, A. et al., "A roadmap for automated power line inspection. Maintenance and repair." Procedia CIRP, Dec. 2013, pp. 234-239.
Barbosa et at., "Corrosion detection robot for energized power lines." 3rd International EEE Conference on Applied Robotics for the Power Industry (CARPI), 2014.
Extended European Search Report from corresponding European patent application 17873895.1, Apr. 22, 2020.
CIGRE Working Group B3.47, "Application of robotics in substations", brochure technique, référence: 807, 156 p., Jun. 2020. URL : https://e-cigre.org/publication/807-application-of-robotics-in-substations.
Gene Wolf, "Droids and Drones", T&D World, 31 août 2020. URL : https://www.tdworld.com/test-and-measurement/article/21138573/droids-and-drones.
J. Allan, J. Beaudry, "Robotic systems applied to power substations—A state-of-the-art survey," Proceedings of the 2014 3rd International Conference on Applied Robotics for the Power Industry, Foz do Iguassu, pp. 1-6, 2014. DOI : 10.1109/CARPI.2014.7030049 URL : https://ieeexplore.ieee.org/document/7030049.
Gregory Cole, Harshang Shah, Craig Stiegemeier, Jamie Stapleton, "ABB's TXplore robot redefines transformer inspection", ABB, Oct. 24, 2018. URL : https://new.abb.com/news/detail/7870/abbs-txplore-robot-redefines-transformer-inspection.
Apellix, "Aerial Robotic Systems for the Built Environment", Appelix.com.
Brent Barker, "Robots take on tough tasks in transmission and distribution", EPRI Journal, Jan. 29, 2019. URL : https://eprijournal.com/robots-take-on-tough-tasks-in-transmission-and-distribution/.
Luke Van Der Zel, "138-kV Research Substation", T&D World, Jul. 3, 2019. URL : https://www.tdworld.com/substations/article/20972818/138kv-research-substation.
EPRI, "Research on Substation Robot Application", Product ID 3002019592, Supplemental Project Notice, 2 p., Jun. 8, 2020. URL : https://www.epri.com/research/products/3002019592.
EPRI, "Robotic Inspection Technologies for Transformers: Laboratory and Field Assessments", Product ID 3002015700, Technical Update, 100 p., Jul. 19, 2019. URL : https://www.epri.com/research/products/3002019141.
EPRI, "Robotic Inspection Technologies for Transformers: Laboratory and Field Assessments", Product ID 3002019141, Technical Update, 105 p., Nov. 3, 2020. URL : https://www.epri.com/research/products/3002019141.
NS Energy Staff Writer, "Mini submersible robot successfully inspects power transformer", NS Energy Business, Jan. 26, 2020. URL : https://www.nsenergybusiness.com/news/mini-submersible-robot-successfully-inspects-power-transformer/.
Patrick Haddad, "NYPA successfully deploys submersible robot inside power transformer", Power Transformer News, Jan. 29, 2020. URL : https://www.powertransformernews.com/2020/01/29/_trashed/.
Chris Warren, "Can Artificial Intelligence Transform the Power System", EPRI Journal, 4 p., January/Feb. 2019. URL : https://eprijournal.com/wp-content/uploads/2019/01/2019.01-02A_Artificial-Intelligence.pdf.
EPRI, "Artificial Intelligence for Transmission Images", Product ID 3002020110, Supplemental Project Notice, 2 p., Oct. 29, 2020. URL : https://www.epri.com/research/products/3002020110.
Mike Putt, "Using Tomorrow's Technology Today", FPL, Mar. 28, 2018. URL : https://www.fplblog.com/using-tomorrows-technology-today/.
Laura Layden, "FPL shows off drone, robot technology", Naples Daily News, Jun. 2, 2016. URL : https://www.naplesnews.com/story/news/local/2016/06/02/fpl-shows-off-drone-robot-technology/86058584/.
FPL, "An even brighter future is on the horizon", YouTube, Feb. 3, 2020. URL : https://www.youtube.com/watch?v=La0gef3LAzs.
"Florida Power and Light using robot to spot malfunctioning equipment", WPTV News, May 3, 2018. URL : https://www.youtube.com/watch?v=M7UEOf0iws8.
"FPL reveals new autonomous substation robot", WPTV News, Apr. 11, 2018. URL : https://www.youtube.com/watch?v=mx_iiaMyRNc.
"FPL Debuts First Substation Robot in Miami-Dada County", Black PR Wire, Apr. 10, 2019. URL : https://www.blackprwire.com/press-releases/bprw-fpl-debuts-first-substation-robot-in-miami-dade-county.
Boston Dynamics, Twitter, Feb. 3, 2020. URL : https://twitter.com/bostondynamics/status/1224380527244910598.

(56) References Cited

OTHER PUBLICATIONS

Jackie Alkobi, "At Florida Power and Light, Autonomous Drones Speed Utility Emergency Response", Percepto, Apr. 16, 2020. URL : https://percepto.co/at-florida-power-and-light-autonomous-drones-speed-utility-emergency-response/.
Maureen Kenyon, "'Drone in a box' technology provides Florida Power & Light easier way to assess infrastructure", TC Palm, Feb. 20, 2020. URL : https://www.tcpalm.com/story/news/2020/02/19/fpl-drone-box-another-tool-check-plant-infrastructure/4760778002/.
Shoshanna Solomon, "Israeli drones to help Florida's emergency response to hurricane season", The Times of Israel, Jul. 16, 2020. URL : https://www.timesofisrael.com/israeli-drones-to-help-floridas-emergency-response-to-hurricane-season/.
Kcel Energy, "Energy Innovation", 6 p., 2019. URL : https://www.xcelenergy.com/staticfiles/xe-responsive/Company/Corporate%20Responsibility%20Report/2019%20CRR/2019_Energy%20Innovation_CRR.pdf.
"FAA Approves Milestone Drone Flights for Xcel Energy", T&D World, Apr. 18, 2018. URL : https://www.tdworld.com/overhead-transmission/article/20971162/faa-approves-milestone-drone-flights-for-xcel-energy.
Eileen P. Lockhart, James Dwyer, J. Peter Gomez, "Xcel Energy Deploys Unmanned Aircraft Systems", T&D World, Jun. 13, 2018. URL : https://www.tdworld.com/substations/media-gallery/20971369/xcel-energy-deploys-unmanned-aircraft-systems.
Eileen P. Lockhart, James Dwyer, J. Peter Gomez, "UAS to the Rescue", T&D World, May 18, 2018. URL : https://www.tdworld.com/overhead-transmission/article/20971296/uas-to-the-rescue.
RG&E, "NYSEG and RG&E Testing Drones—A New Tool for the Reliability Tool Box", 2015. URL : https://www.rge.com/wps/portal/rge/networksfooter/ourcompany/!ut/p/z0/hYyxTsNAEER_ZSISRns2DgpIZCEQyAE6c421ds6Xg2PXOS8Q_z0GCqhIN6N589BijZbpPXjSIExx7k_2ojnPqqubojTb68v1xjyaslw_bO9yU2R4i_Yf4D77MuSpKiuPdiDdLwP3grW8pU5eB-KpF1GXTniKb094PhzsBm0nrO6oWCfvyKfmV7YwfzN3DbuPcWFyk63mOo3OA_EO5h-bGzWwh10SdiMsgWCGQUUi9JJA9w6Si4HaEINOP0MrRxxebLuK_uwThrwCuw!!/.
ULC Robotics, "Electric Utility Innovation: Circuit Breaker Racking Robot". URL : https://ulcrobotics.com/network-innovation-and-energy-industry-research-and-development/breaker-racking-robot/.
Elizabeth Leland, "Robot keeps workers away from hazards", Duke Energy, Dec. 16, 2019. URL : https://illumination.duke-energy.com/articles/robot-keeps-workers-away-from-hazards.
"inoLECT releases wireless version of inoRAC", BIC Magazine, Jun. 12, 2018. URL : https://www.bicmagazine.com/resources/products-services/inolect-releases-wireless-version-of-inorac/.
"Remote Racking with inoRAC2 : Universal Remote Racking Device", YouTube, Mar. 28, 2016. URL : https://www.youtube.com/watch?v=-mRQ6wdFiRk.
F. Aminifar, F. Rahmatian, "Unmanned Aerial Vehicles in Modern Power Systems: Technologies, Use Cases, Outlooks, and Challenges," in IEEE Electrification Magazine, vol. 8, No. 4, pp. 107-116, Dec. 2020. URL : https://ieeexplore.ieee.org/document/9276537.
ULC Robotics, "Increasing substation efficiency using unmanned aerial inspection". URL : https://ulcrobotics.com/project/uav-substation-inspection-2018/.

"World's First UT Integrated Drone Deployed", NDT.org, Nov. 1, 2017. URL : https://www.ndt.org/news.asp?ObjectID=62398.
PRODRONE, "PRODRONE was awarded the FY2020 "Intellectual Property Achievement Awards" ", Jun. 8, 2020. URL : https://www.prodrone.com/notice/6585/.
"Une plate-forme de gestion et d'exploitation des données collectées par drone", Enerzine, Mar. 26, 2019. URL : https://www.enerzine.com/une-plate-forme-de-gestion-et-dexploitation-des-donnees-collectees-par-drone/26841-2019-03.
"Drone Automation Software Features AI-Powered Analytics", T&D World, Jun. 7, 2020. URL : https://www.tdworld.com/vegetation-management/article/21133338/drone-automation-software-enables-organizations-to-plan-operate-analyze-and-collaborate-global-drone-missions.
"ANRA Technologies Launches Drone Flight Management System", T&D World, Oct. 20, 2020. URL : https://www.tdworld.com/test-and-measurement/article/21145296/anra-technologies-launches-drone-flight-management-system.
Ashley Carman, "Here's a drone with claws", The Verge/Circuit Breaker, Sep. 11, 2016. URL: https://www.theverge.com/circuitbreaker/2016/9/11/12879206/prodrone-claw-arm-drone.
Robert Beckhusen, Robo-Chopper Dives and Grabs Objects Like a Bird of Prey, Wired, Mar. 19, 2013. URL: https://www.wired.com/2013/03/drone-claw/.
Voliro, "Solution" page of website, Voliro AG.
https://www.theverge.com/circuitbreaker/2016/9/11/12879206/prodrone-claw-arm-drone.
Video: Robo-Chopper Dives and Grabs Objects Like a Bird of Prey; https://www.wired.com/2013/03/drone-claw/.
https://voliro.com/solution/.
https://www.apellix.com/.
Serge Montambault And Nicolas Pouliot: "Hydro-Québec's Power Line Robotics Program: 15 years of development, implementation and partnerships", 3rd IEEE International Conference on Applied Robotics for the Power Industry (CARPI), Jan. 1, 2014 (Jan. 1, 2014), pp. 1-6, XP055510361.
http://inspectionsweden.se/ROBHOT/default_eng.html.
https://www.youtube.com/watch?v=SFkDdyuJAlg&feature=youtu.be.
https://www.facebook.com/cablewalker/.
https://www.f6s.com/cablewalker.
https://tsuru.su/en/2020/06/08/cablewalker_first_automatic/.
E. Titov, O. Limanovskaya, A. Lemekh and D. Volkova, "The Deep Learning Based Power Line Defect Detection System Built on Data Collected by the Cablewalker Drone," 2019 International Multi-Conference on Engineering, Computer and Information Sciences (SIBIRCON), Novosibirsk, Russia, pp. 0700-0704, 2019. URL : https://ieeexplore.ieee.org/document/8958397.
Asset management in grid companies using integrated diagnostic devices URL : https://www.witpress.com/elibrary/eq-volumes/4/3/2504.
The way for detecting defects of ground wires of power lines by the method of magnetic scanning URL : https://www.daaam.info/Downloads/Pdfs/proceedings/proceedings_2019/128.pdf.
https://www.uasvision.com/2015/09/09/aerial-robot-lands-on-powerlines/.
https://linebird.net/.

* cited by examiner

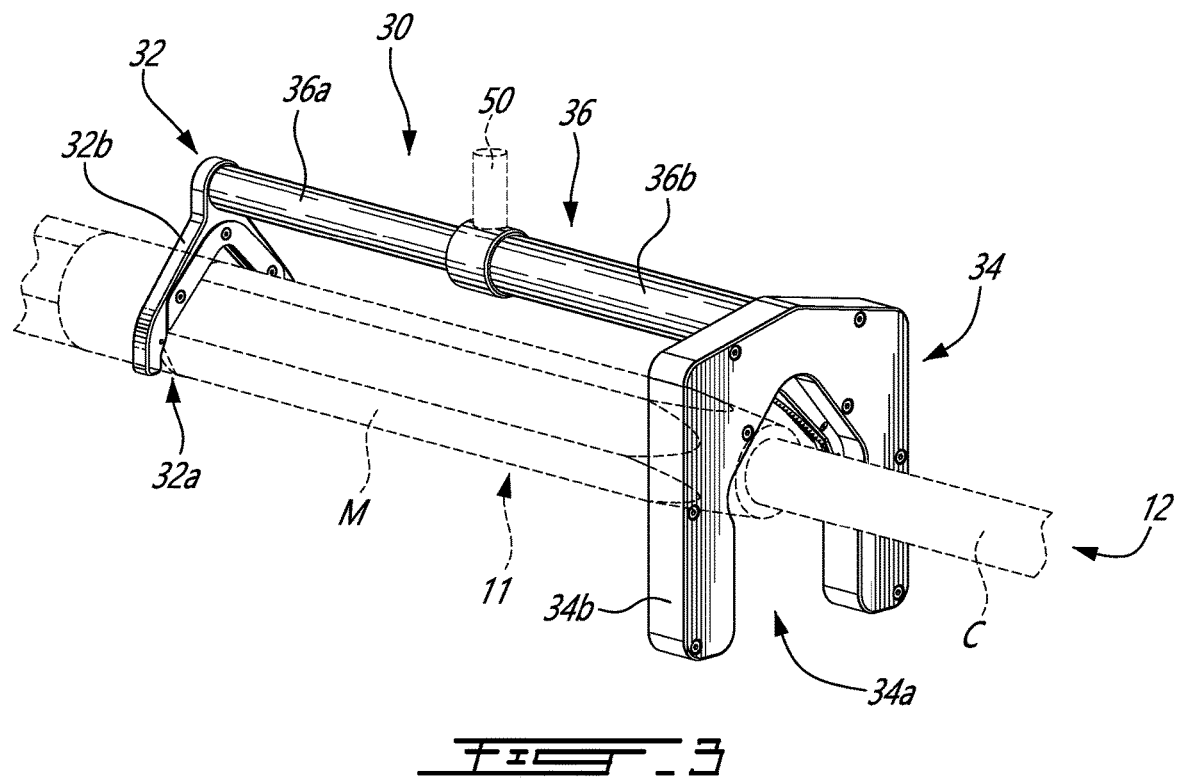
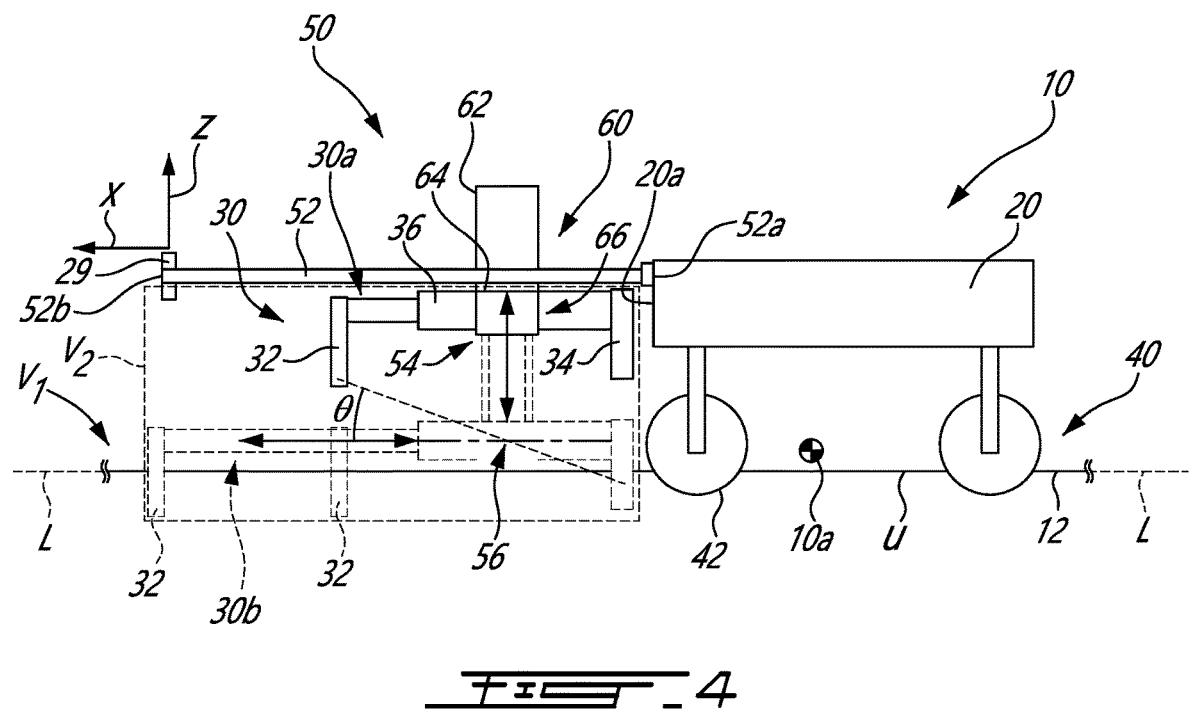

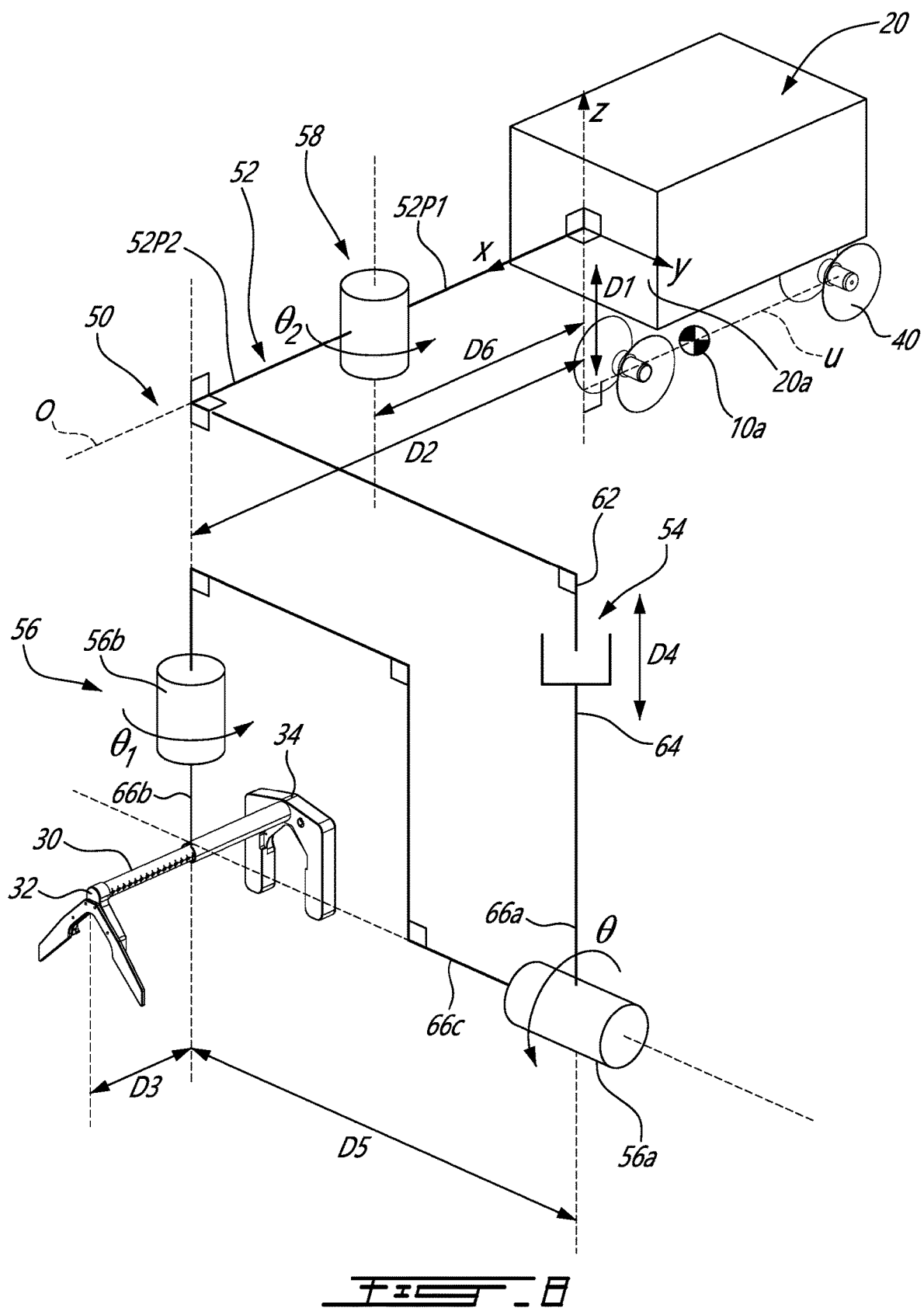

DRONE WITH TOOL POSITIONING SYSTEM

CROSS-REFERENCE TO RELATED APPLICATIONS

This application claims priority to Canadian patent application filed Apr. 30, 2021 and entitled "DRONE AVEC SYSTEME DE POSITIONNEMENT D'OUTIL", whose application number is 3,116,940. The entire content is incorporated by reference herein.

TECHNICAL FIELD

The application relates generally to power lines and, more particularly, relates to an apparatus and a method for inspecting components thereof.

BACKGROUND

The operation of power lines requires inspecting or monitoring power line components. Some conventional so-called indirect inspection techniques comprise observation using a visual or infrared camera. These techniques may be inadequate for detecting the existence of damage or wear to a component, particularly within it. Most of the alternatives which make it possible to characterize the interior of the components prove to be tedious, expensive and/or even destructive, in particular when it comes to sampling the component for ex situ analysis. Some of the more penetrating techniques involve the use of particularly cumbersome electromagnetic radiation apparatuses.

The use of a robot equipped with the inspection equipment and controlled remotely can prove to be advantageous for the implementation of certain techniques. Whether it is a robot designed to bear and move directly on the line and/or an airborne-type robot, establishing and maintaining an adequate position of the inspection equipment relative to the targeted component can be arduous or even impossible.

SUMMARY

There is disclosed an unmanned aerial vehicle mountable relative to a power line for monitoring a component of the line, the unmanned aerial vehicle comprising: a body having sides and a propulsion system to lift, lower and navigate the vehicle relative to the line; a tool positioning system including a displacement module having a first member mounted to the body, a second member movable vertically relative to the first member, and a tool holder pivotably coupled to the second member; and a monitoring tool mountable to the tool holder to be positioned remotely from the body on one side of the sides of the body and to be movable with the tool holder relative to the body for mounting to or around the component.

There is disclosed a method of positioning an unmanned aerial vehicle relative to a component of a power line, the method comprising: landing a body of the vehicle on the line with a side of the body at a distance from the component of the line; and moving a component monitoring tool relative to the side of the body in a vertical direction along the side of the body to mount the monitoring tool to or around the component.

There is disclosed a tool positioning system of an unmanned aerial vehicle mountable relative to a power line to monitor a component of the line, the tool positioning system comprising: a displacement module having a first member mountable to one side of a body of the unmanned aerial vehicle, a second member movable vertically relative to the first member on the side of the body, and a tool holder pivotably coupled to the second member and couplable to a tool, the tool holder being movable relative to the body to mount the tool to or around the component.

DESCRIPTION OF THE DRAWINGS

Reference is now made to the accompanying figures, in which:

FIG. 3 is an enlarged perspective view of a component monitoring tool of FIG. 1, shown in contact with the portion of the power line of FIG. 2A;

FIG. 4 is a side view of the unmanned aerial vehicle of FIG. 1, showing a vertical displacement range of a tool positioning system of the vehicle;

FIG. 8 is a schematic illustration of a kinematic chain for a tool positioning system of an unmanned aerial vehicle.

DETAILED DESCRIPTION

Figure 1:
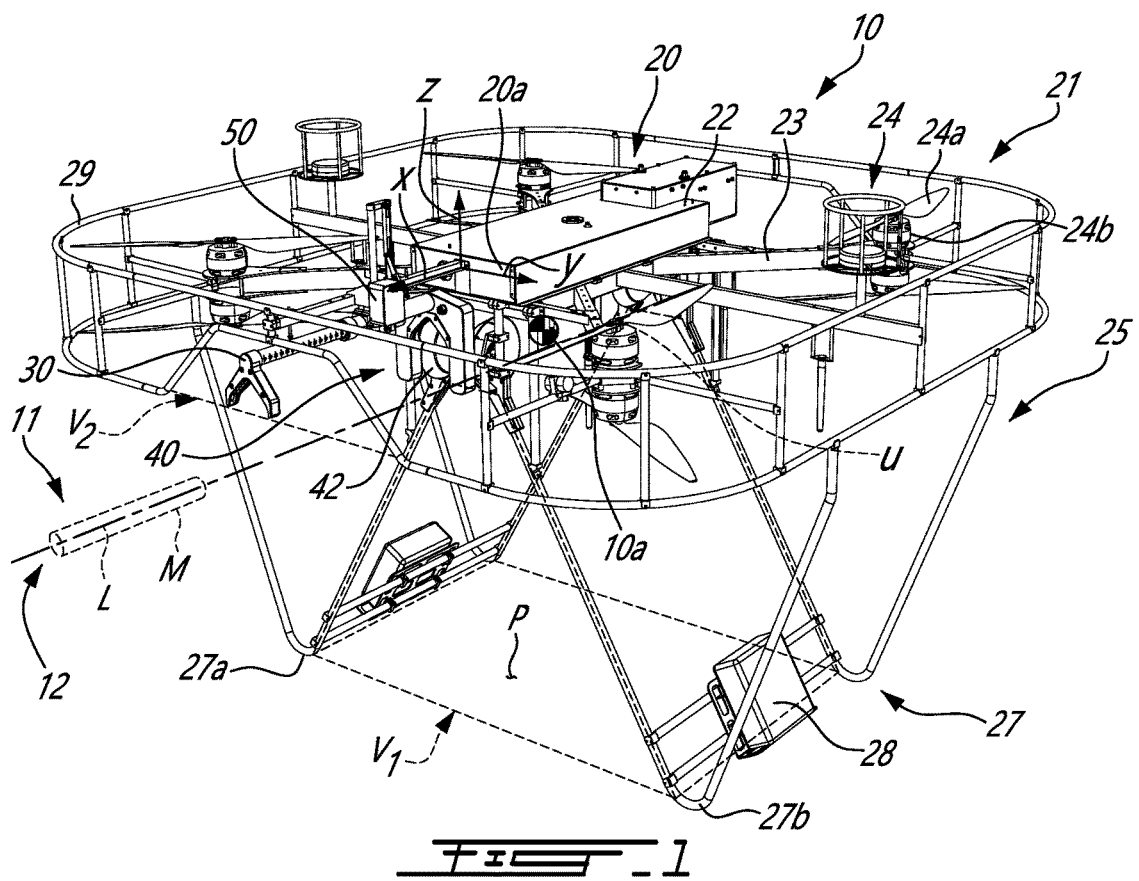
FIG. 1 is a perspective view of an unmanned aerial vehicle, the vehicle mounted on a power line near a component of the line.

FIG. 1 illustrates an unmanned aerial vehicle 10 (sometimes referred to herein as a "drone," or simply "UAV 10"). The UAV 10 is used to inspect an electrical component 11 (hereinafter "component 11") of an electrical line 12. The electrical line 12 can take several forms and comprises all the different types of aerial lines in the field of transmitting an electric current. The electrical line 12 is therefore sometimes referred to in the present description simply as "the line 12." By way of example and with reference to FIG. 1, the electrical line 12 is an aerial electricity transmission line. The component 11 is located on a portion of the line 12 suspended at a distance from the ground. As described in more detail below, the UAV 10 can be positioned close to the component 11, while an operator of the UAV 10 can be at a safe distance from the line 12, such as on the ground below the line 12. Various communication modes can be used for UAV 10 control purposes. For example, communication via cellular or satellite network may allow control of the UAV 10 by an off-site operator. The use of the UAV 10 to monitor the component 11 of the line 12 may be advantageous when it is situated in a location to which sending personnel would require specialized transportation means, such as a helicopter.

The UAV 10 comprises a body 20, a monitoring tool 30 mounted to the body 20, a displacement assembly 40 for displacing the UAV 10 relative to the line 12, and a positioning system 50 through which the monitoring tool 30 is mounted to the body and which allows the monitoring tool 30 to be displaced relative to the body 20.

The body 20 is a structural component of the UAV 10 which is intended to support, contain and/or interconnect various members or components of the UAV 10. The body 20 can assume any suitable shape to achieve such a functionality. The body 20 comprises a propulsion system 21 in order to provide lift and/or thrust to the UAV 10 for aerial displacement (or aerial navigation) purposes controllable via a control unit of the UAV 10. In FIG. 1, the body 20 comprises a housing 22 which contains the control unit of the UAV 10. The control unit exchanges with a remote computer for the transmission of data acquired by the UAV 10 and the reception of instructions transmitted for example selectively by the operator and/or in an automated manner via the computer. The control unit comprises a processor which executes algorithms to aid in the operation of the UAV 10, for example by processing the received data and the data intended to be transmitted. In other embodiments, the control unit can operate according to autonomous flight instructions stored in memory located within the UAV 10 itself. Arms 23 of the body 20 extend outward from the housing 22 to rotor assemblies 24 of the propulsion system 21. Each of the rotor assemblies 24 includes a propeller 24a and an electric motor 24b for driving the propeller 24a. The control unit communicates with and coordinates the rotor assemblies 24 to generate lift for the UAV 10 and to maneuver it in flight in response to remote control instructions provided by the operator. Several components are envisaged to assist in the navigation of the UAV 10, for example a visual camera, a lidar system ("light detection and ranging") or other suitable system to provide an indication of the position of the UAV 10 in relation to its environment, such as the line 12 and its components 11. This feedback is communicated by the control unit to the technician and helps the technician steer the UAV 10 relative to the line 12.

A landing gear 25 is mounted to the body 20 via the arms 23 and extends vertically downward relative to the body 20. The landing gear 25 comprises a base 27 defining a support plane P. The base 27 makes it possible to support the weight of the body 20 and of the other components of the UAV 10 when the base 27 is positioned on flat and horizontal ground so that the support plane P is parallel to the ground. The base 27 is configured to form two parts respectively on either side of a longitudinal axis U of the UAV 10, i.e. two feet 27a, 27b spaced apart from one another. It should be noted here that a three-dimensional axis system specific to the UAV 10 is defined by an axis X parallel to the axis U and perpendicular to a first side 20a of the body 20, an axis Z parallel to a direction normal to the support plane P, and an axis Y orthogonal to the axes X and Z. Batteries 28 of the UAV 10 are installed on the landing gear 25 adjacent to the feet 27a, 27b. This positioning of the batteries 28 allows the mass of the UAV 10 to be distributed so that a center of gravity 10a of the UAV 10 is lowered relative to the body 20. The center of gravity 10a of the UAV 10 thus lowered gives the UAV 10 improved stability and balance when it is not supported horizontally, for example when it is resting on the line 12.

The displacement assembly 40 of the UAV 10 is located under the body 20 between the feet 27a, 27b, and defines the axis U. In FIG. 1, the displacement assembly 40 comprises rolling elements 42 connected to the body 20 in a pivotable manner, located one after the other and respectively near the first side 20a of the body 20 and close to a second side of the body 20 opposite the first side 20a. The UAV 10 is configured so that a clearance, or unobstructed volume V1 (hereinafter the "volume V1"), extends between the feet 27a, 27b from the support plane P and upwardly to the displacement assembly 40. The volume V1 is therefore open along the axis Z at the plane P, and along the axis X on either side of the feet 27a, 27b and on either side of the displacement assembly 40. This configuration of the UAV 10 therefore allows it to span the line 12, that is to say, to be positioned relative to the line 12 so that the displacement assembly 40 rests on the line 12 while the feet 27a, 27b extend downward on either side of the line 12. Although the portion of the line 12 is suspended and can define a parabola between two support structures located on either side, the line 12 can be discretized into linear segments each extending along an axis L. The UAV 10 can be positioned so that the axis U is oriented along the axis L, for example by resting on the line 12 via the displacement assembly 40. A cage 29 supported by the arms 23 surrounds the body 20, thus forming a protective enclosure for maintaining a distance between the components of the UAV 10 located inside the cage 29 and the external environment. The cage 29 is outside the volume V1, so that the line 12 and the component 11 can be received inside the volume V1 near the body 20. It will be understood that the body 20 is not limited to the configuration described above and that other configurations for the body 20 are within the scope of the present disclosure. The component 11 to be monitored can correspond to any structure of the line 12, for example a portion of any conductive cable of the line 12, whether it is energized or not. In the illustrated example, the component 11 to which the UAV 10 is sent is a junction element of the line 12. In one of its many possible forms, the junction element is a sleeve M.

Figure 2A:
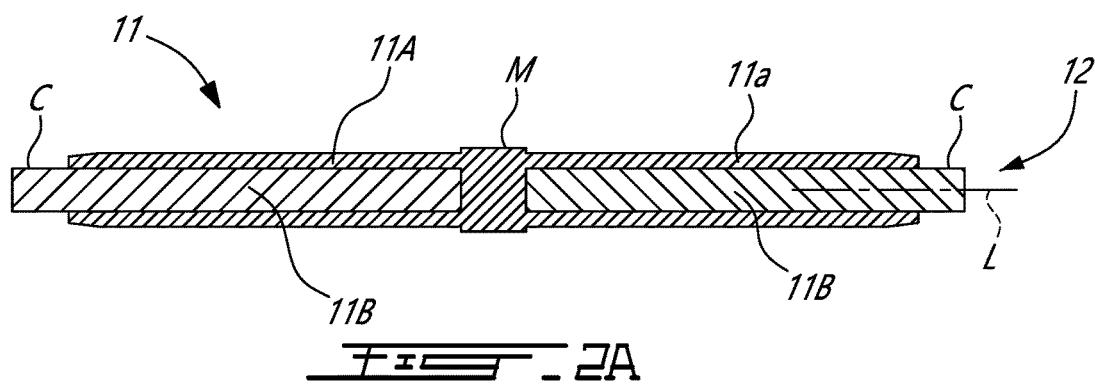
FIG. 2A is a side cross-sectional view of a portion of the power line of FIG. 1 including the component of FIG. 1.

In FIG. 2A, it can be seen that the sleeve M is provided with two opposite ends each having a connector 11a provided to receive one end 11b of a conductor cable C (hereinafter, the "cable C") of the line 12. A first end 11b of a first cable C of the line 12 extends along the axis L. A first connector 11a of the sleeve M has an elongated shape matching that of the first end 11b.

Figure 2B:
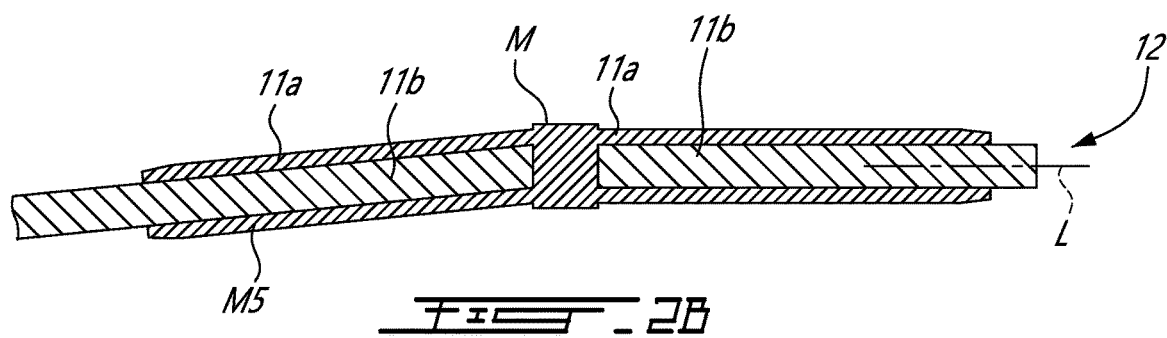
FIG. 2B is a side cross-sectional view of a portion of the power line of FIG. 1 with a component.

Referring to FIG. 2B, although the component 11 and the first cable C may both extend generally along the axis L, the component 11 may have surfaces whose position and/or orientation relative to the axis L vary locally. One of the connectors 11a may be eccentric with respect to the other and/or with respect to the axis L. In some cases, a portion M5 of the sleeve M having one of the connectors 11a may deviate with respect to the other connector 11a and/or with respect to the axis L. Such a plastic deviation can be expressed according to an angle at which a point of the deviated portion M5 of the sleeve M is located with respect to a corresponding point of a portion of the sleeve M aligned with the axis L. This deviation can occur, for example, when installing the sleeve M on the line 12. Indeed, a hydraulic press could be used to assemble the ends 11b of the cables C to the sleeve M. The pressure applied by the press can cause the portion M5 of the sleeve M to deviate from the other portion of the sleeve M, as illustrated in FIG. 2B. Such a deviation of the portion M5 of the sleeve M will also lead to the deviation of the end 11b of the cable C covered by the portion M5.

Referring to FIG. 3, the monitoring tool 30 (sometimes referred to herein simply as "tool 30") will now be described in more detail. The tool 30 comprises two resistance measuring devices 32, 34, each of which is used to measure the electrical resistance of one of the components of the line 12. The resistance measuring devices 32, 34 (sometimes referred to herein simply as "devices 32, 34") are supported respectively by the sleeve M and the cable C of the line 12. As will be explained in more detail below, the devices 32, 34 are adapted to be positioned at a distance from each other and in direct electrical contact with the component 11 so that the electrical resistance of the component 11 between the devices 32, 34 can be measured via the tool 30.

In FIG. 3, the devices 32, 34 are connected to an elongated element 36 to form the tool 30. It is moreover by means of the elongated element 36 that the tool 30 is joined to the positioning system 50, which extends from the body 20 and from the outside of the first side 20a of the body 20. Thus mounted, the devices 32, 34 are located on either side of the junction between the elongated element 36 and the positioning system 50, while the tool 30 extends away from the first side 20a of the body 20. The device 32 may therefore be referred to as "distal device 32," while the device 34 may be referred to as "proximal device 34." The elongated element 36 is telescopic and comprises an inner tubular element 36a which is movable in and relative to an outer tubular element 36b. The inner and outer tubular elements 36a, 36b can be moved relative to each other to vary the distance between the devices 32, 34, in order to increase or decrease this distance. In one possible configuration of the tool 30, the inner tubular element 36a is attached to the distal device 32 and the outer tubular element 36b is attached to the proximal device 34. The tool 30 is joined to the positioning system via the outer tubular element 36b. The elongated element 36 may comprise wires, rods or other links to provide an electrical connection between the devices 32, 34. The elongated element 36 may also comprise a processor for measuring the electrical resistance with the devices 32, 34 and for wirelessly communicating the measured electrical resistance of the component 11.

Each of the devices 32, 34 has an arcuate shape partially surrounding a corresponding space 32a, 34a. In this embodiment, the two devices 32, 34 are each provided with a pair of arms 32b, 34b arranged on either side of the corresponding space 32a, 34a. The devices 32, 34 are arranged so that the spaces 32a, 34a are opposite and open in the same direction, so that the component 11 can be received by the spaces 32a, 34a in this direction. Once the component 11 has been received by said spaces 32a, 34b, the electrical contact with the component 11 can be established by each of the devices 32, 34 via one or the other of the arms 32b, 34b. A distance between the arms 32b of the distal device 32 could be at least equal to the diameter of the sleeve M, while a distance between the arms 34b of the proximal device 34 could be at least equal to the diameter of the cable C.

The tool 30 is used to monitor the condition of the cable C, the sleeve M and/or the junction between them, i.e. the condition of the component 11. Although it is shown and described herein as being used primarily for diagnostic purposes, in other embodiments the tool 30 is used for interventions on the line 12. These interventions include, but are not limited to, inspection, repair or maintenance tasks. In the illustrated embodiment, the tool 30 includes an ohmmeter and is used to measure the electrical resistance of the cable C, the sleeve M and/or the component 11. The electrical resistance of the component 11 is determined by knowing or measuring the amperage of the cable C and then measuring the voltage drop due to the resistance of the component 11 (or any other component) being tested. It will be understood that the electrical resistance of the component 11, which is generally expressed in ohm (Ω), is a measure of the difficulty in passing an electric current through this component 11. If the component 11 generates a greater electrical resistance, this may indicate that the component 11 is physically damaged and therefore requires inspection for damage, repair or subsequent replacement. The electrical resistance of the component 11 can also be used as an indicator of the state of physical degradation of the component 11. In another embodiment, the tool 30 includes a device for determining the extent of the galvanic protection on the conductor 11B and/or the component 11. In another embodiment, the tool 30 includes an X-ray device for capturing images of the interior of the component 11. In yet another embodiment, the tool 30 includes an abrasive element for rubbing against an exterior surface of the component 11 to remove a layer of debris, ice or degraded material therefrom. It will thus be understood that the tool 30 is not limited to the illustrated embodiment and that other types of tools 30 for monitoring the component 11 fall within the scope of the present disclosure.

As will be described in more detail below, the tool 30 can be moved relative to the body 20. In particular, the tool 30 can be moved vertically by means of the positioning system 50, for example along the axis Z, between a first raised position and a second lowered position. This makes it possible, inter alia, to move the UAV 10 along the line 12 toward the component 11 until the tool 30 is close to the component 11, without the movement of the UAV 10 being impeded by either the displacement assembly 40, or the tool 30. The tool 30 is also pivotable via the positioning system 50 from various positions between the raised position and the lowered position. This arrangement advantageously allows the tool 30 to follow a shape of the component 11 as the UAV 10 moves along the line 12 with the tool 30. In other words, the UAV 10 can be moved along the line 12 to move the tool 30 relative to the component 11 so that an orientation of the tool 30 relative to the body 20 of the UAV 10 is changed to achieve an orientation of the component 11 with respect to the line 12.

The positioning system 50 is arranged on the body 20 so that the tool 30 is offset. The term "offset" means that the tool 30, in whole or in part, is offset along the axis X with respect to the first side 20a of the body 20, is offset to the displacement assembly 40 and/or is offset to the center of gravity 10a of the UAV. The term "offset" means that the tool 30 is offset to lie parallel to the axis L of the cable C with respect to the first side 20a of the body 20, with respect to the displacement assembly 40 and/or with respect to the center of gravity 10a of the UAV. This offset configuration of the tool 30 causes the tool 30 to move ahead of the body 20 and the displacement assembly 40 as the UAV 10 moves along the line 12 toward the component 11, the body 20 being oriented so that the axis U is generally parallel to the axis L.

In FIG. 4, the entire tool 30 is offset from the first side 20a of the body 20, the proximal device 34 of the tool 30 being closer to the body 20 than the distal device 32. The tool 30 is raised relative to the displacement assembly 40 in the first position (shown at 30a). In the second position (shown at 30b in dotted lines), the tool 30 is at the same vertical level as the displacement assembly 40. This configuration of the positioning system 50 makes it possible to adjust the vertical position of the tool 30 according to a vertical position of the component 11 relative to the axis L. In some embodiments, the displacement assembly 40 is mounted to the body 20 so as to allow a relative movement along the axis Z, and therefore to move the body 20 and the positioning system 50 away from the line 12 while the positioning assembly 40 is pressed on the line 12. The positioning system 50 therefore makes it possible to adjust the vertical position of the tool 30 to compensate for the distance of the body 20 relative to the displacement assembly 40, that is to say, the distance of the body 20 relative to the axis U.

Referring to FIG. 4, the positioning system 50 comprises a displacement module 60 provided with a first member 62 mounted to the body 20 and a second member 64 coupled to the first member 62 through an offset kinematic joint 54, allowing the vertical displacement of the second member 64 relative to the first member 62. The positioning system 50 also comprises a tool holder 66 coupled to the second member 64 via a so-called distal joint 56, allowing the tool holder 66 to pivot relative to the second member 64 according to one or more degrees of freedom, of which one of the degrees of freedom is shown schematically in FIG. 4 with an angle G. The tool holder 66 (and the tool 30 that it supports) is therefore movable vertically with the second member 64 relative to the first member 62, and pivotable relative to the second member 64, while being offset relative to the center of gravity 10a of the body 20 and relative to the displacement assembly 40.

Several configurations of the positioning system 50 are possible to achieve this functionality. By way of example, and with reference to FIG. 4, the positioning system 50 includes a support arm 52 extending longitudinally from the first side 20a of the body 20 from a first end 52a attached to the body 20 on its first side 20a to a second end 52b on the first side 20a and remote from the body 20. The second end 52b is fixed to the cage 29. In other possible configurations, the second end 52b is free. The first member 62 of the displacement module 60 is fixed to the support arm 52 away from the body 20 on its first side 20a, so that the second member 64 is vertically movable with the tool holder 66 relative to the support arm 52, at a distance from the body 20 on its first side 20a. The support arm 52 overhangs an unobstructed working volume V2 of the UAV 10 (hereinafter, "working volume V2"). The support arm 52 defines an upper vertical limit of the working volume V2, which extends vertically to a lower vertical limit located closer to the axis U of the UAV 10 than to the support arm 52. The unobstructed working volume V2 is positioned only on the side 20a of the body 20 where the tool 30 is located. In some embodiments, the lower vertical limit of the working volume V2 is located between the axis U and the support plane P. Alternatively, the first member 62 of the displacement module 60 could be mounted differently, for example to a frame supporting the propulsion system 21 or even to a frame of the cage 29. The support arm 52 could then be omitted. The first member 62 could also be mounted directly to the body 20, in which case the second member 64 could have an elongated shape with one end joined to the first member 62 and a second offset end to which the tool holder 66 would be attached.

Referring to FIG. 4, the displacement module 60 is configured such that the second member 64 is movable relative to the first member 62, located at the upper vertical limit, in order to move the tool holder 66 to the lower vertical limit of the working volume V2. Thus, once the tool 30 is mounted on the tool holder 66 and the UAV 10 is placed on the line 12, the tool 30 is movable by means of the displacement module 60 to be brought closer to the axis U until one or the other of the devices 32, 34 of the tool 30 comes into contact with the line 12. In the event that only one of the two devices 32, 34 comes into contact with the line 12, the offset kinematic joint 54 and the distal joint 56 cooperate so that the device 32, 34 which has come into contact with the line 12 acts as a lever to pivot the tool 30 and the tool holder 66 relative to the second member 64 as the second member 64 is brought closer to the axis U, until the other device 32, 34 also comes into contact with the line 12.

The displacement module 60 and the joints 54, 56 will now be described in more detail, while reference will be made to FIGS. 5A and 5B. The offset kinematic joint 54 is a prismatic joint with a single degree of freedom, that is to say, vertical translation along an axis parallel to the axis Z. In this embodiment, the offset kinematic joint 54 comprises a guideway, or slide 54a, fixed to the support arm 52 and forming part of the first member 62 of the displacement module 60, as well as a movable member, or crosshead 54b, whose movement is constrained by the slide 54a and forming part of the second member 64. In this embodiment, the slide 54a and the crosshead 54b are present in two paired instances, forming a pair of joints arranged to block any rotation of the crosshead 54b about the axis Z. The offset kinematic joint 54 may, however, comprise a single slide 54a and a single crosshead 54b having complementary anti-rotational geometries.

Figure 5A:
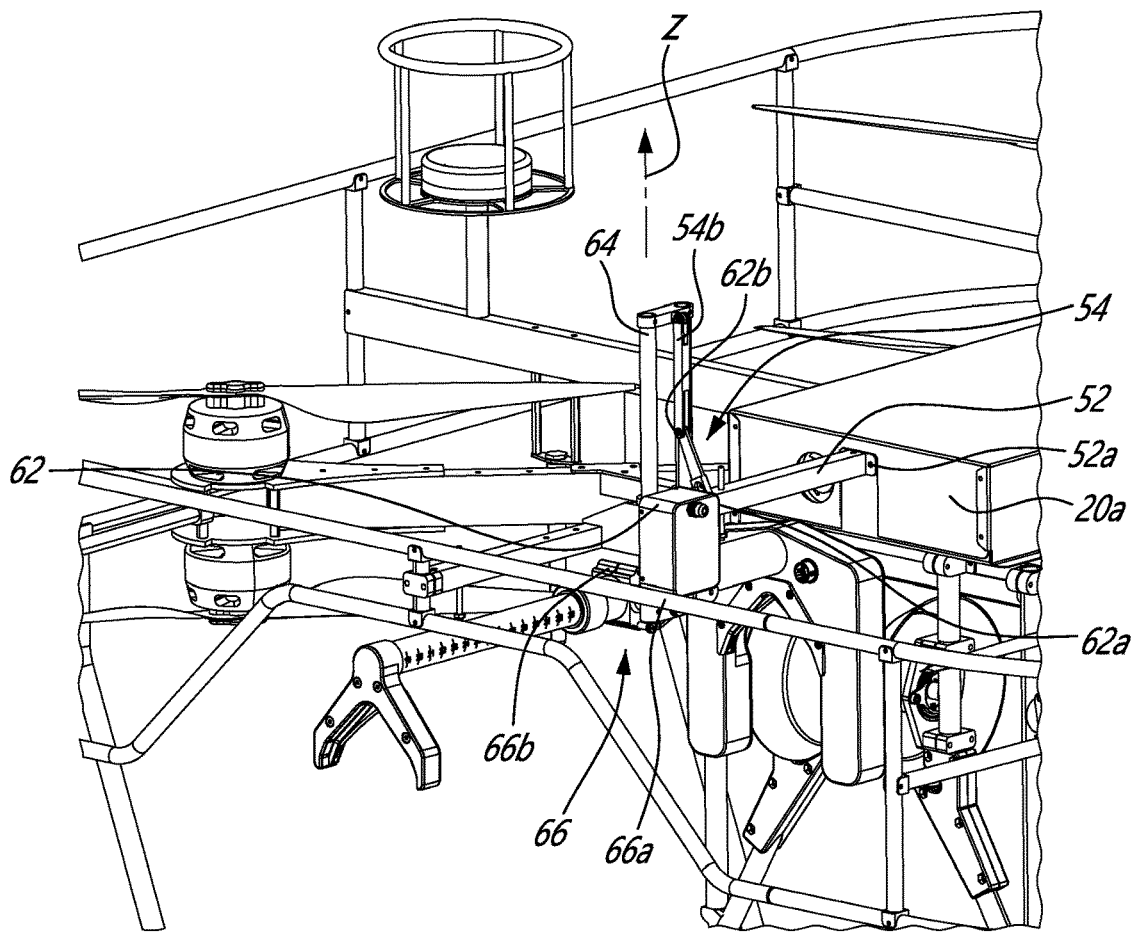
FIG. 5A is a perspective view of the tool positioning system of the vehicle of FIG. 4, a tool holder of the tool positioning system being shown in a first vertical position.
Figure 5B:
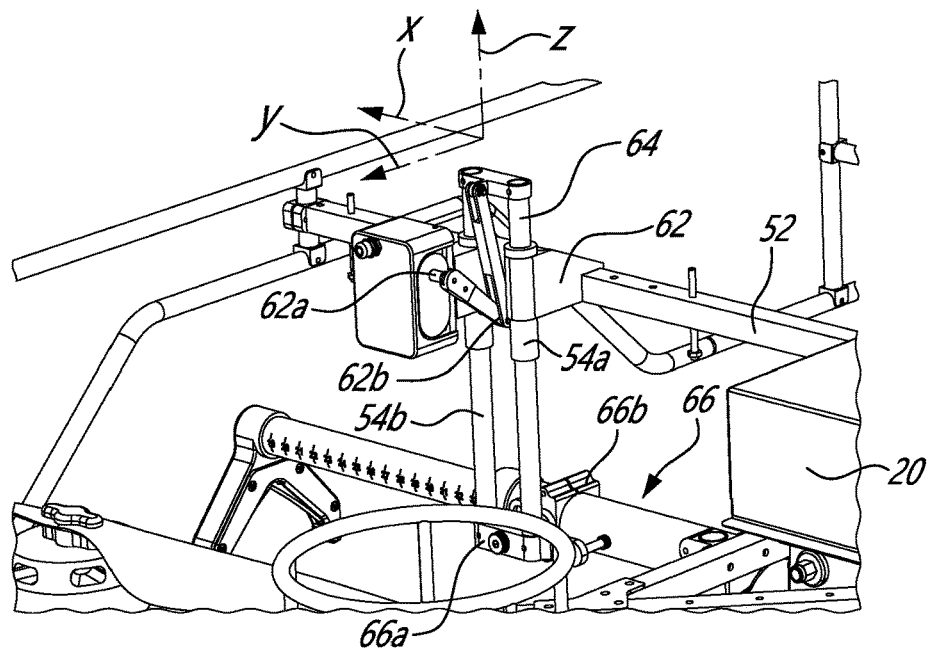
FIG. 5B is a perspective view of the tool positioning system of the vehicle of FIG. 4, the tool holder of the tool positioning system being shown in a second vertical position.

Referring to FIGS. 5A and 5B, the offset kinematic joint 54 is actuated by a motor 62a of the first member 62, located in a housing attached to the support arm 52. The motor 62a, which is electrically connected to the batteries 28 and electronically to the control unit of the UAV 10, is provided with a shaft which can be driven in clockwise or anti-clockwise rotation along an axis having a component parallel to the axis X. A connecting rod 62b connecting the shaft of the motor 62a to the crosshead 54b makes it possible to transform the rotary movement of the motor 62a into vertical movement of the second member 64 relative to the first member 62. In FIG. 5A, the connecting rod 62b is in extension, while the second member 64 and the tool holder 66 are in the raised position. In FIG. 5B, the connecting rod 62b is in flexion, while the second member 64 and the tool holder 66 are in the lowered position. FIG. 5B also shows that the slide 54a is offset with respect to the support arm 52 along the axis Y, while the tool holder 66 is offset with respect to the crosshead 54b in the reverse direction so that the tool 30 is located under the support arm 52 when mounted to the tool holder 66. This alignment of the tool holder 66 relative to the support arm 52 ensures that a force transmitted to the tool holder 66 along the axis X, for example due to friction or impacts encountered by the tool 30 while the tool 30 is moved by the UAV 10 along the line 12, would not generate significant torque at the support arm 52, and therefore at the body 20, about the axis Z. The motor 62a which actuates the offset joint 54 allows the height of the tool 30 to be adjusted relative to the conductor C or to the sleeve M, and also allows the tool 30 to exert a pressure or contact force against the component to be monitored.

Figure 6:
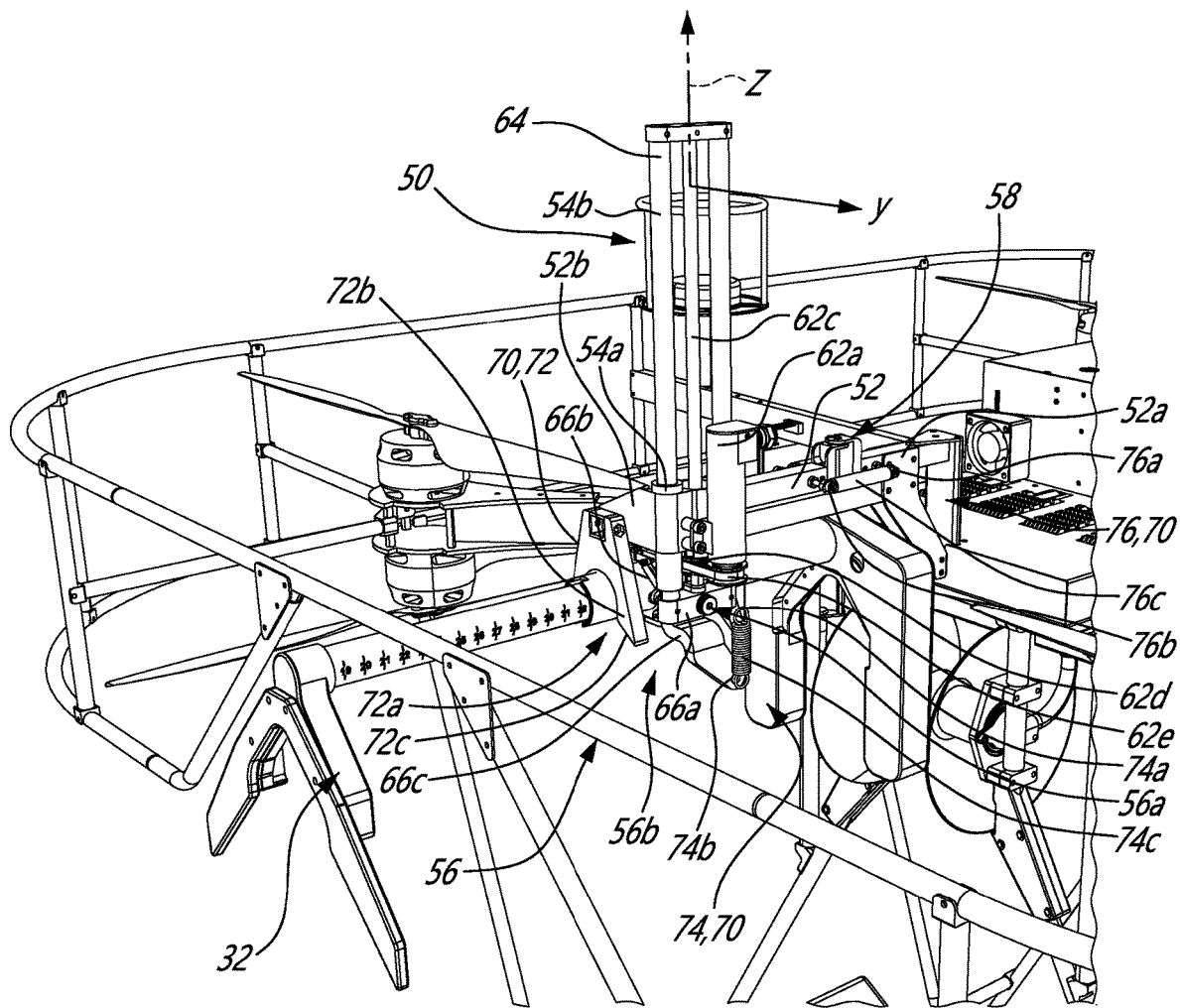
FIG. 6 is a perspective view of another configuration of an unmanned aerial vehicle.

Referring to FIG. 6, the distal joint 56 is a revolving joint comprising a stationary part 66a fixed to the end of the crosshead 54a and a pivotable and offset part 66b, via which the tool 30 can be mounted. The distal joint 56 is configured such that a pitching movement of the tool holder 66 with the tool 30 is possible, i.e. a pivoting movement about an axis having a component parallel to the axis Y. The tool holder 66 is therefore pivotable at a pitch angle with respect to a standard orientation, which in this case is defined by the body 20 and parallel to the axes X and U.

Figure 6A:
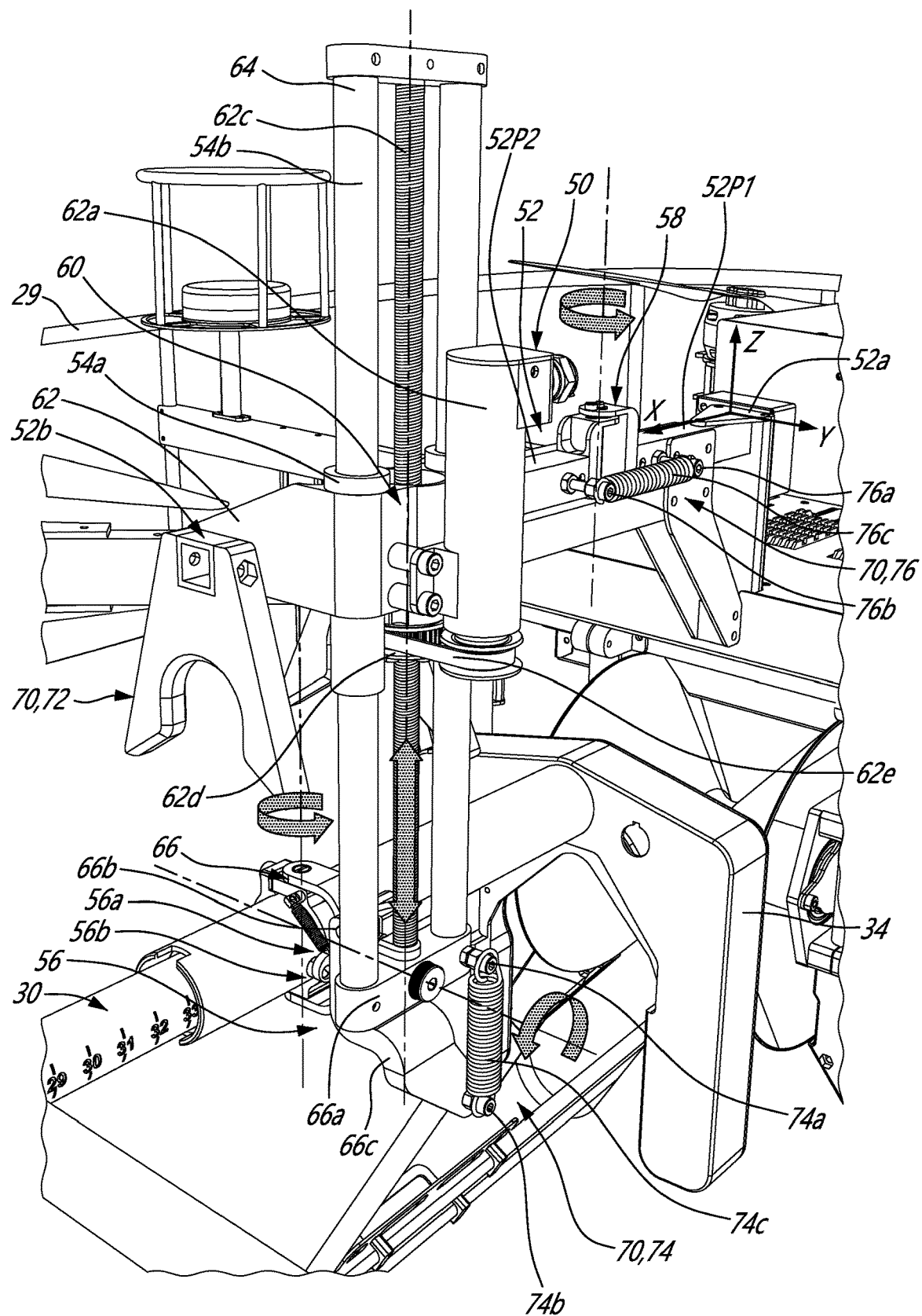
FIG. 6A is another perspective view of a portion of the unmanned aerial vehicle of FIG. 6.

Referring to FIGS. 6 and 6A, another embodiment of the present technology is shown and will be described below.

The distal joint 56 allows the tool holder 66 to pivot relative to the second member 64 about an axis having a component parallel to the axis Z. The distal joint 56 is therefore configured such that a first yawing movement of the tool holder 66 with the tool 30 is made possible. The tool holder 66 is therefore pivotable at a first yaw angle with respect to the standard orientation. In this embodiment, the distal joint 56 allows the tool holder 66, and therefore also the tool 30, to pivot in a yawing movement and a pitching movement relative to the second member 64. The distal joint 56 comprises the revolving joint having the stationary part 66a fixed to the end of the crosshead 54b, referred to in such a case as a first joint 56b of the distal joint 56 allowing the yawing movement. The distal joint 56 comprises an intermediate part 66c, which is pivotable with the pivotable part 66b relative to the stationary part 66a to generate the pitching movement, these parts 66b, 66c being able to be designated as a second joint 56a of the distal joint 56. The intermediate part 66c extends from the end of the crosshead 54b to the pivotable part 66b, in this case from below the end of the crosshead 54b to below the pivotable part 66b. The pivotable part 66b, on which the tool 30 is mounted, is pivotable relative to the intermediate part 66c along the axis having the component parallel to the axis Z to generate the first yawing movement at the tool holder 66. This structural configuration of the distal joint 56 is shown by way of example, while several variants are possible and can confer the adequate degrees of freedom to allow the pitching and/or yawing movements at the tool holder 66. Among other alternatives, the first and second joint 56b, 56a of the distal joint 56 can be replaced with a ball joint.

Referring to FIGS. 6 and 6A, the positioning system 50 is provided with an orientation means 70. A guide 72 of the orientation means 70 is attached to the support arm 52 and cooperates with the tool 30 to force the latter to pivot to the standard orientation while the displacement module 60 raises the tool 30 toward the raised position. The guide 72 is a structure of arcuate shape partially surrounding a cavity 72a open downwards, provided with two arms 72b arranged on either side of the cavity 72a. Each arm 72b is provided with a surface 72c extending from one end of the arm 72b toward the cavity 72a. The surface 72c is oriented so that the tool contacting the surface 72c while oriented at the first yaw angle will be directed to the standard orientation as it slides toward the cavity 72a along the surface 72c, as shown in FIG. 6. The orientation means 70 also comprises a biasing means 74, comprising a first attachment point 74a linked to the second member 64 of the displacement module 60, a second attachment point 74b linked to the intermediate part 66c of the distal joint 56 and a resilient element 74c having two parts spaced apart from each other and respectively attached to one of the attachment points 74a, 74b. The resilient element 74c in this case is a helically shaped metal spring, but other types of resilient elements are possible. The resilient element 74c is configured such that reversible strain is induced in the resilient element 74c as the pitch angle increases from the standard orientation, and in this case more particularly as a pitch motion elevates the distal device 32 vertically, creating tension in the resilient element 74c. Such a movement can occur in the presence of a vertical drop in the line 12, for example when the distal device 32 is in contact with the first conductive cable C of the line 12 and is moved on the sleeve M of the line 12, acting as a ramp forcing a pitching motion of sufficient magnitude for the distal device 32 to cross the drop between the cable C and the sleeve M. If the distal device 32 is removed from the sleeve M toward the cable C, the resilient element 74c would be restored to its original shape, thus inducing a pitching movement returning the tool holder 66 and the tool 30 to the standard orientation.

Referring to FIGS. 6 and 6A, the positioning system 50 comprises a proximal kinematic joint 58. The support arm 52 is configured in two parts. A first part 52P1 having the first end 52a is mounted to the body 20, while a second part 52P2 of the support arm 52 having the second end 52b is pivotable relative to the first part 52P1, through the proximal kinematic joint 58 between the two parts 52P1,52P2 of the support arm 52. The proximal kinematic joint 58 corresponds in this case to a revolving joint. The second end 52b is free and can move freely in the configuration of FIGS. 6 and 6A because it is not connected to an external structure such as the cage 29. The second part 52P2 of the support arm 52 is therefore pivotable above the working volume V2 and about an axis having a component parallel to the axis Z. Since the displacement module 60 is mounted to the second portion 52P2 of the support arm 52, the proximal kinematic joint 58 is configured such that a second yawing motion of the tool holder 66 with the tool 30 is made possible by the pivoting of the second part 52P2 of the support arm 52. The tool holder 66 is therefore pivotable at a second yaw angle with respect to the standard orientation. The orientation means 70 comprises a so-called proximal biasing means 76. This proximal biasing means 76 comprises a first attachment point 76a linked to the first part 52P1 of the support arm 52, a second attachment point 76b linked to the second part 52P2 of the support arm 52 and a resilient element 76c having two parts spaced apart from each other and respectively attached to one of the attachment points 76a, 76b. The resilient element 76c is in this case a metallic coil spring, but other types of resilient elements are possible. The proximal biasing means 76 is configured such that reversible strain is induced in the resilient element 76c as the second yaw angle increases from the standard orientation, causing tension in the resilient element 76c. Such a movement can occur in the presence of a horizontal deviation in the line 12, for example when the distal device 32 in contact with the first conductive cable C of the line 12 is moved on the sleeve M of the line 12, acting as a ramp forcing a yawing motion of sufficient magnitude for the distal device 32 to cross the deviation between the cable C and the sleeve M. If the distal device 32 is removed from the sleeve M toward the cable C, the resilient element 76c would be restored to its original shape, thus inducing a yawing movement returning the tool holder 66 and the tool 30 to the standard orientation. In other embodiments of the positioning system 50, one or the other of the components of the orientation means 70 may be arranged differently or even be omitted.

In the embodiment shown in FIGS. 6 and 6A, the motor 62a is provided with a shaft which can be driven in clockwise or counterclockwise rotation about an axis having a component parallel to the axis Z. A screw 62c arranged on the crosshead 54b is received by a nut 62d arranged on the slide 54a, the nut 62d being blocked in translation but free to rotate about an axis parallel to that of the motor 62a. A belt 62e connecting the shaft of the motor 62a to the nut 62d makes it possible to transform the rotary movement of the motor 62a into vertical movement of the second member 64 relative to the first member 62.

Figure 7A:
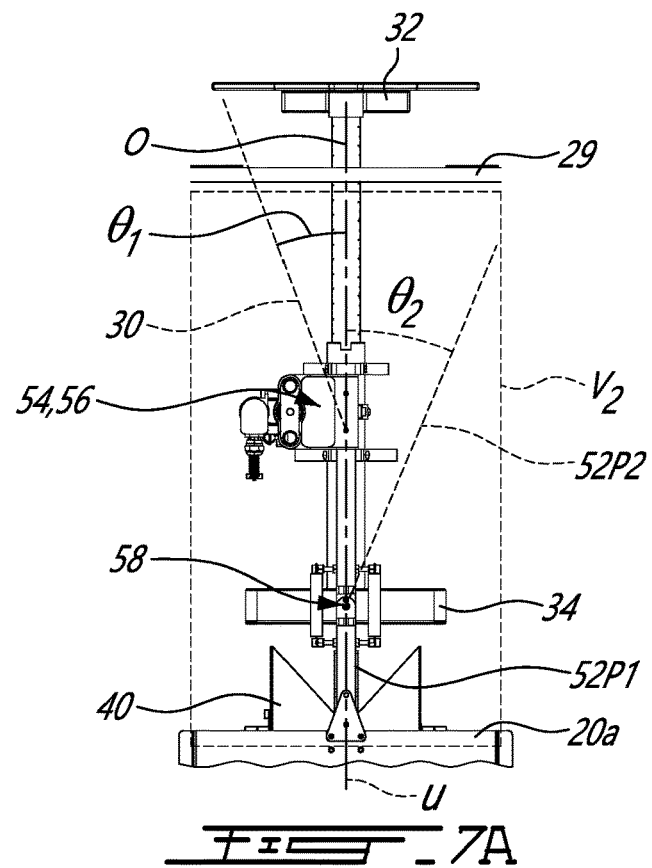
FIG. 7A is a top view of the vehicle of FIG. 6, showing a tool holder and a support arm of a tool positioning system of the vehicle respectively pivoted by a first angle and by a second angle with respect to a body of the vehicle.
Figure 7B:
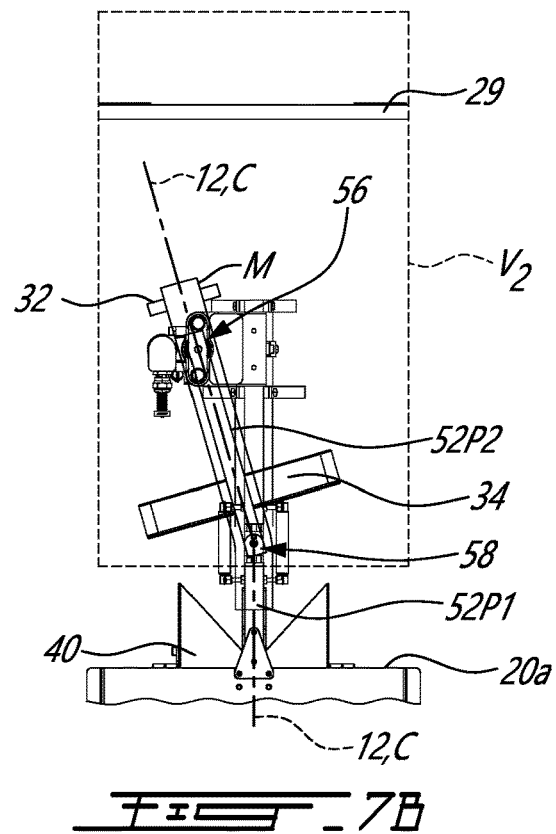
FIG. 7B is a top view of the vehicle of FIG. 6, showing the tool holder and the support arm respectively pivoted relative to the body of the vehicle.

FIGS. 7A and 7B illustrate some of the positions of the tool 30 made possible by the joints 54, 56, 58. In FIG. 7A, the standard orientation, shown at O, and the ranges of yawing movement relative to the standard orientation O are shown at φ1 (including the first yaw angle of the intermediate part 66c of the tool holder 66 relative to the second member 64 of the displacement module 60) and φ2 (including the second yaw angle of the second part 52P2 of the support arm 52 relative to the first part 52P1 of the support arm 52) respectively. FIG. 7B illustrates a position of the tool 30 following yawing movements at the proximal 58 and distal 56 joints generated as the orientation of the tool 30 conforms to a deviation of the sleeve M and the line 12, and as the UAV 10 is supported by the line 12 by means of the displacement assembly 40. The alignment of the tool 30 and its ability to conform with the alignment of the line 12 or of the component to be monitored occur passively. The joints 54, 56, 58 allow a rotational adjustment of the passive tool 30, which is triggered when the tool 30 is moved by the positioning system 50 to contact the component. This passive rotary adjustment of the tool 30 requires no application of force or other intervention by the positioning system 50.

FIG. 8 is a schematic illustration of a kinetic chain of the UAV 10 and of various components thereof, the modalities of which may differ depending on the embodiment. The axis X is parallel to the axis U and they are perpendicular to the same vertical plane. A vertical distance D1 between the axes X and U may vary from one embodiment to another, and may be variable in certain embodiments. A variation in the distance D1 can correspond to a relative movement between the support arm 52 and the displacement assembly 40, and by a vertical displacement of the center of gravity 10a of the UAV 10. The distance D1 can be set so that the vertical position of the center of gravity 10a promotes the balance of the UAV 10 with respect to the axis U, for example when the UAV 10 is supported on the line 12 by means of the displacement assembly 40.

The offset kinematic joint 54 is located at a horizontal distance D2 from the first side 20a of the body 20 along the axis X. The distance D2 can for example be the distance, along the axis X and the support arm 52, from the first side 20a to the positioning system 50 via which the tool 30 is mounted on the body 20. The distance D2 can for example be established as a function of the length of the tool 30, or the dimension between the devices 32, 34. The distal device 32 is located at a horizontal distance D3 from the offset joint 54. Considering that the configuration of the tool 30 shown in FIG. 8 allows an adjustment of its length, the distance D3 can be varied manually, or automatically by means of a displacement module suitably arranged with the inner and outer tubular elements 36a, 36b of the tool 30. The distance D3 can be established so that the distal device 32 can be positioned outside the working volume V2, for example beyond the perimeter defined by the cage 39. For other configurations of the tool 30 which do not allow an adjustment of their lengths, the distance D3 has a value of zero.

The offset joint 54 is configured to cause a vertical displacement of the tool holder 66 over a distance D4. The distance D4 can be set, for example, so that the tool 30 can travel at least to the axis U in the lowered position. The distance D4 can be set, for example, so that the tool 30 can go at least to the axis L of the line 12 in the lowered position.

The distal joint 56, when present, can be moved vertically from a position offset along the axis X, by means of the offset joint 54. The distal joint 56 allows the tool 30 to pivot relative to the second member 64 along an axis having a component parallel to the axis Z. The distal joint 56 comprises the first joint 56b allowing the yawing movement. The tool 30 is therefore pivotable at the first yaw angle φ1 with respect to the standard orientation O. In the embodiment of FIG. 8, the distal joint 56 also allows a pitching movement. The distal joint 56 comprises the second joint 56a, which is pivotable with the pivotable part 66b relative to the stationary part 66a to generate the pitching movement according to the angle θ. The tool 30 is therefore pivotable at a pitch angle θ with respect to the standard orientation O. The distal joint 56 is located at a vertical position when the offset joint 54 is in the raised position. In the embodiments in which the distal joint 56 is provided with the first and second joints 56a, 56b, as shown in FIG. 8, a non-zero horizontal distance D5 is defined between them indicating that the axis of the first yaw angle is offset in a direction parallel to the axis Y of the first part 52P1 of the support arm 52. In another possible embodiment where the distance D5 is zero, the axes of rotation of the first and second joints 56a, 56b intersect at a point, allowing the tool 30 to self-orient to better couple with the conductor C or the sleeve M.

The proximal joint 58, when present, is located between the offset joint 54 and the first side 20a of the body 20, at a distance D6 along the axis X from the first side 20a. The first end 52a of the first part 52P1 support arm 52 is mounted to the first side 20a of the body 20, while the second end 52b is pivotable relative to the first part 52P1, by means of the proximal kinematic joint 58. The proximal joint 58 allows the second part 52P2 of the support arm 52, and therefore the tool 30 supported indirectly by the second part 52P2, to pivot at the second yaw angle φ2 relative to the first part 52P1 of the support arm 52 and the body 20. The axes of rotation around which the first and second yaw angles φ1, φ2 are defined are parallel and are distanced from each other, thus making it possible to offset the tool 30 in parallel to improve its alignment with the conductor C or with the sleeve M. Referring to FIG. 8, the axis of the vertical translational movement defined by the offset joint 54 is parallel to the axis of rotation defined by the proximal joint 58. Depending on the rotation effected in the pitch angle θ at the second rotary joint 56a, the axis of rotation of the first joint 56b can also be parallel to the axis of rotation of the proximal joint 58, thus allowing a parallel offset of the tool 30 on the side 20a of the body 20. In a possible embodiment where the distance D5 is zero, the axis of the vertical translational movement defined by the offset joint 54 and the axes of rotation of the first and second joints 56a, 56b intersect at a point. The axis of the vertical translational movement defined by the offset joint 54 is positioned elsewhere at a distance from the first and second joints 56a, 56b in another possible embodiment.

The positioning system 50 and its possible degrees of freedom which are shown in FIG. 8 allow passive adjustment of the tool 30 so that it aligns better with the component 11 to be monitored. In the embodiment of the positioning system 50 which comprises the joints 54, 56, 58, the positioning system 50 defines or comprises the following four degrees of freedom: three rotary degrees of freedom allowing the tool 30 to move and to orient itself with respect to the body 20 according to the first and second yaw angles φ1, φ2 and according to the pitch angle θ, and another degree of translational freedom allowing the tool 30 to move vertically with respect to the body 20. In the embodiment of the positioning system 50 which comprises the joints 54, 56, 58, the order of the degrees of freedom from the body 20 of the vehicle 10 is as follows: 1) a rotary degree of freedom at the second yaw angle φ2, 2) a translational degree of freedom defined by the offset joint 54, 3) a rotary degree of freedom at the first yaw angle φ1, and 4) a rotary degree of freedom at the pitch angle θ. The four degrees of freedom which form the kinetic chain of the positioning system 50 between the body 20 of the vehicle 10 and the tool 30 are composed of three rotary joints (e.g. the joints 56a, 56b, 58) and a prismatic joint (e.g. the offset joint 54).

In view of the above, the reader will appreciate that the distances D1-D6 as well as the ranges of rotation and/or translation of the various joints 54, 56, 58 appear among the parameters which may differ from one embodiment to another.

The above description is given only by way of example, and those skilled in the art will recognize that modifications can be made to the described embodiments without departing from the scope of the described disclosure. Such modifications within the scope of this disclosure will be apparent to those skilled in the art in light of a consideration of the present disclosure, and are intended to be comprised within the scope of the appended claims.

The invention claimed is:

1. An unmanned aerial vehicle mountable relative to a power line for monitoring a component of the line, the unmanned aerial vehicle comprising: a body having sides and a propulsion system to lift, lower and navigate the vehicle relative to the line; a tool positioning system including a displacement module having a first member mounted to the body, a second member movable vertically relative to the first member, and a tool holder pivotably coupled to the second member; and a monitoring tool mountable to the tool holder to be positioned remotely from the body on one side of the sides of the body and to be movable with the tool holder relative to the body for mounting to or around the component, wherein the tool holder is movable vertically relative to the first member.

2. The unmanned aerial vehicle according to claim 1, wherein the tool holder is pivotable at a pitch angle and/or a yaw angle, relative to the second member.

3. The unmanned aerial vehicle according to claim 2, wherein the tool holder is pivotable at the pitch angle, and the tool positioning system includes orientation means for biasing the tool holder from the pitch angle to a standard orientation of the tool holder relative to the second member.

4. The unmanned aerial vehicle according to claim 1, wherein the tool positioning system includes a support arm extending longitudinally between a first end mounted to the one side of the body and a second end positioned away from the one side of the body, the first member of the displacement module mounted to the support arm away from the first end on the one side of the body.

5. The unmanned aerial vehicle according to claim 4, wherein at least part of the support arm is pivotable relative to the body so as to pivot the displacement module and the tool holder relative to the body at a yaw angle.

6. The unmanned aerial vehicle according to claim 5, wherein the tool positioning system includes means for biasing the support arm from the yaw angle to a standard orientation of the support arm.

7. The unmanned aerial vehicle according to claim 5, wherein the tool holder is pivotable at a first yaw angle with respect to the second member about a first axis, the support arm being pivotable at a second yaw angle with respect to the body along a second axis parallel to the first axis.

8. The unmanned aerial vehicle according to claim 5, wherein the monitoring tool is in a standard orientation of the monitoring tool when the support arm is in the standard orientation of the support arm and the tool holder is in the standard orientation of the tool holder.

9. The unmanned aerial vehicle according to claim 4, wherein the monitoring tool is disposed beneath the support arm.

10. The unmanned aerial vehicle according to claim 4, wherein an unobstructed working volume is defined below the support arm and on the one side of the sides of the body, the unobstructed working volume sized so that a portion of the line having the component can be received within the unobstructed working volume, the monitoring tool being movable via the tool positioning system to be mounted to or around the component in the unobstructed working volume.

11. The unmanned aerial vehicle according to claim 10, comprising a cage mounted to the body and at least in part circumscribing the unobstructed working volume, the monitoring tool mountable to the tool holder to extend from the tool holder inside the cage to outside of the cage.

12. The unmanned aerial vehicle according to claim 1, wherein the monitoring tool has a proximal device and a distal device positioned remotely from the proximal device, the monitoring tool being mountable to the tool holder at a location between the proximal device and the distal device so that the proximal device is closer to the body than the distal device.

13. The unmanned aerial vehicle according to claim 1, wherein the displacement module includes a motor attached to the first member and connected to the second member for displacing the second member.

14. The unmanned aerial vehicle according to claim 13, wherein the motor is connected to the second member by a connecting rod arranged between the motor and the second member.

15. The unmanned aerial vehicle according to claim 13, wherein the motor is connected to the second member by a nut mounted on a screw arranged relative to the second member.

16. A tool positioning system of an unmanned aerial vehicle mountable relative to a power line to monitor a component of the line, the tool positioning system comprising: a displacement module having a first member mountable to one side of a body of the unmanned aerial vehicle, a second member movable vertically relative to the first member on the side of the body, and a tool holder pivotably coupled to the second member and couplable to a tool, the tool holder being movable relative to the body to mount the tool to or around the component, wherein the tool holder is movable vertically relative to the first member.

* * * * *